United States Patent [19]
Lin et al.

[11] Patent Number: 6,150,916
[45] Date of Patent: *Nov. 21, 2000

[54] ARCHITECTURE OF POLY FUSES

[75] Inventors: Jy-Hwang Lin, Kaohsiung; Tsan-Wen Liu, Chilung, both of Taiwan

[73] Assignee: United Microelectronics Corp., Taiwan

[*] Notice: This patent issued on a continued prosecution application filed under 37 CFR 1.53(d), and is subject to the twenty year patent term provisions of 35 U.S.C. 154(a)(2).

[21] Appl. No.: 09/149,929

[22] Filed: Sep. 9, 1998

[30] Foreign Application Priority Data

May 18, 1998 [TW] Taiwan ................... 87107656

[51] Int. Cl.[7] .................... H01H 37/36; H01L 27/10; H01L 27/115
[52] U.S. Cl. .................. 337/297; 337/159; 337/416; 257/209; 257/529
[58] Field of Search .................. 337/5, 297, 296, 337/290, 159–161, 298, 401, 404, 405, 416, 417; 174/261; 257/209, 529, 530

[56] References Cited

U.S. PATENT DOCUMENTS

| | | | |
|---|---|---|---|
| 4,413,272 | 11/1983 | Mochizuki et al. | 357/65 |
| 4,723,155 | 2/1988 | Uchida | 357/51 |
| 4,910,418 | 3/1990 | Graham et al. | 307/465 |
| 5,362,676 | 11/1994 | Gordon et al. | 437/192 |
| 5,523,253 | 6/1996 | Gilmour et al. | 437/60 |
| 5,622,892 | 4/1997 | Bezama et al. | 438/601 |
| 5,767,020 | 6/1998 | Sakaguchi et al. | 438/705 |

FOREIGN PATENT DOCUMENTS

| | | | |
|---|---|---|---|
| 405326715A | 12/1993 | Japan | H01L 21/82 |
| 06174304 | 2/1996 | Japan | H01L 21/82 |
| 409017870A | 1/1997 | Japan | H01L 21/82 |

*Primary Examiner*—Leo P. Picard
*Assistant Examiner*—Anatoly Vortman
*Attorney, Agent, or Firm*—Hickman Coleman & Hughes, LLP

[57] ABSTRACT

An architecture of poly fuses includes a number of fuses, a dielectric layer, a sheet-like etching stop layer, and a passivation layer, wherein the sheet-like etching stop layer further includes a number of slices, and wherein each of the slices corresponds to one of the fuses underneath. The architecture of poly fuses according to the invention reduces the energy dispersion during the defective recovering process, and improves the recovery rate for defective memory cells.

5 Claims, 2 Drawing Sheets

ARCHITECTURE OF POLY FUSES

CROSS-REFERENCE TO RELATED APPLICATION

This application claims the priority benefit of Taiwan application serial no. 87107656, filed May 18, 1998, the full disclosure of which is incorporated herein by reference.

BACKGROUND OF THE INVENTION

1. Field of the Invention

This invention relates to a poly fuse, and more particularly, to the architecture of poly fuses, which have a sheet-like etching stop layer.

2. Description of Related Art

Yield is one of the most important factors regarding the fabrication of semiconductor devices. An entire semiconductor memory device has to be abandoned even if there is only one defective memory cell within the device. It is obvious that more defects occur during the fabrication process of a semiconductor device as the integration of the device increases. In the other words, as the integration of a semiconductor device increases the corresponding yield of the device decreases.

Because of the density of memory cells within a semiconductor memory is increasing, memory fabrication techniques become more difficult and complicated. Since it is impossible to eliminate the presence of particles or crumblings, which decreases the yield, during a fabrication process of a semiconductor device, a so-called redundancy circuit is conventionally used to make up the desired yield of a semiconductor memory. A redundant memory cell array is provided in the so-called redundancy circuit technique besides the regular memory array used to store binary data, wherein the redundant memory array replaces the defective memory cells within the regular memory array. Each of the memory cells within the redundant memory cell array is individually connected to the corresponding wordline and bitline. If a number of the memory cells found to be defective within the regular memory array is somewhere in the order of thousands after the test, the memory cells within the redundant memory cell array replace those memory cells found to be defective to make the memory still an irreproachable one.

The conventional redundancy circuit technique surely can improve the yield of a semiconductor memory, but under a condition that the number of defective memory cells within the regular memory array is less than the number of redundant memory cells within the redundant memory cell array. As long as the number of defective memory cells within the regular memory array is less than the number of redundant memory cells within the redundant memory cell array, the defective memory cells can be replaced by the redundant memory cells to resulting in a perfect memory. However, if the number of defective memory cells within the regular memory array exceeds the number of redundant memory cells within the redundant memory cell array, the semiconductor memory has to be abandoned because there are not enough redundant memory cells to substitute for the defective memory cells. As described above, within a conventional semiconductor memory, it is common to have a redundant memory cell array around the regular memory cell array to replace defective memory cells in case defects occur to enable the memory to remain defect-free. Generally, the regular memory cell array and the redundant memory cell array in a conventional memory are connected through poly fuses, which can be broken by a laser beam or an electrical current. In the case that a defective memory cell is found and needs to be recovered, the corresponding poly fuse is broken by a laser beam or an electrical current; if there are no defective memory cells found, poly fuses remain connected.

FIG. 1 shows a cross-sectional view of the architecture of a conventional poly fuse. As shown in FIG. 1, there are fuses 12 located on a provided substrate 10, wherein the fuses include polysilicon. A dielectric layer 14 is formed through a low pressure chemical vapor deposition (LPCVD) process on the substrate 10 and the fuses 12, wherein the dielectric layer 14 includes silicon dioxide. Then, an etching stop layer 16 is formed on the dielectric layer 14 through a reactive sputtering process, wherein the etching stop layer 16 includes silicon nitride. Then, a passivation layer 18 is formed on the etching stop layer 16 through a chemical vapor deposition (CVD) process, wherein the passivation layer 18 includes silicon dioxide.

FIG. 2 is a top view showing the architecture shown in FIG. 1. The large-area, plate-like etching stop layer 16 is used to protect the fuses 12 from being damaged. In the case that a defective memory cell is found, the corresponding fuse is broken by an electrical current or a laser beam, so that the redundant memory cell can be used to replace the defective memory cell to recover the defect. However, the large-area, plate-like etching stop layer 16 disperses the laser used to break fuses. In result, the large-area, plate-like etching stop layer 16 causes the laser beam to waste energy and a low recovery rate for the defective memory cells.

In fact, the recovery rate for the defective memory cells is only about 50% or even lower with an laser of power at about $2 \times 10^{-6} - 3 \times 10^{-6}$ Joules. Increasing the power of laser does raise the recovery rate for the defective memory cells, but it also damages the wafer.

According to the foregoing, the architecture of conventional fuses has drawbacks including:

1. The large-area, plate-like etching stop layer 16 disperses the laser used to break fuses causes the laser beam to waste energy and a low recovery rate for the defective memory cells; and
2. A laser with a higher energy increases the recovery rate for the defective memory cells, but it also causes damages on the wafer.

SUMMARY OF THE INVENTION

It is therefore an objective of the present invention to provide a architecture of poly fuses having a sheet-like etching stop layer, to reduce the energy wasted by the laser beam and raise the recovery rate for the defective memory cells. Each slice of the sheet-like etching stop layer according to the invention corresponds to a poly fuse.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
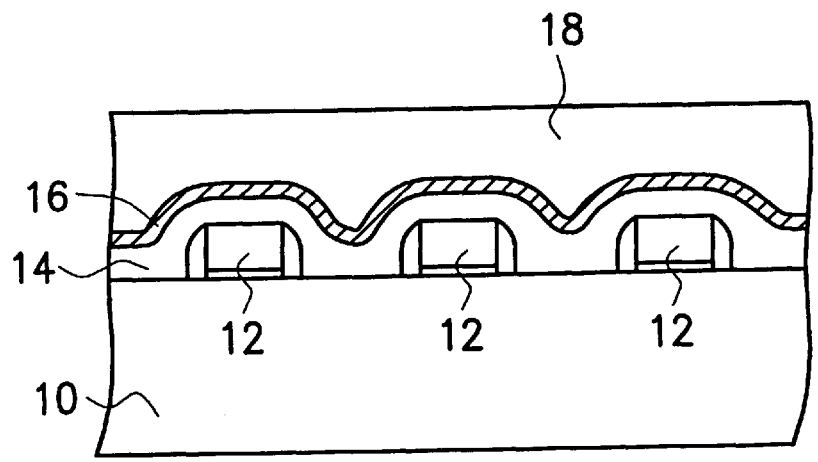
FIG. 1 is a cross-sectional view showing a conventional architecture of fuses in a semiconductor memory.
Figure 2:
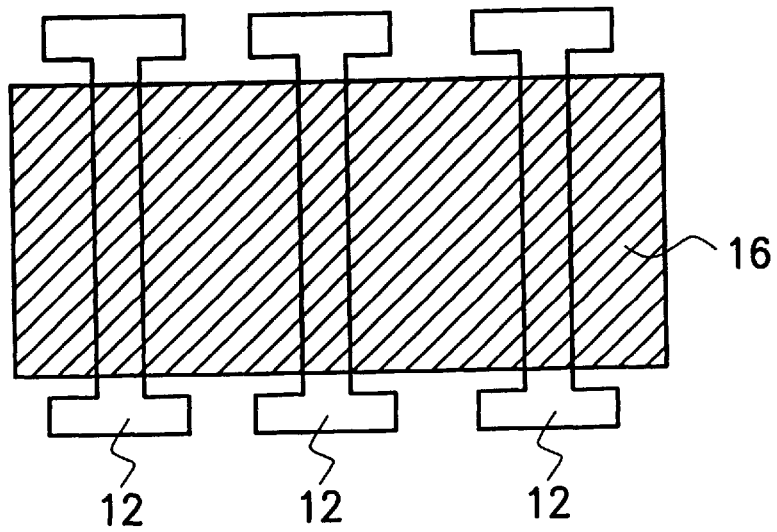
FIG. 2 is a top view showing a conventional architecture of fuses in a semiconductor memory as shown in FIG. 1.
Figure 3A:
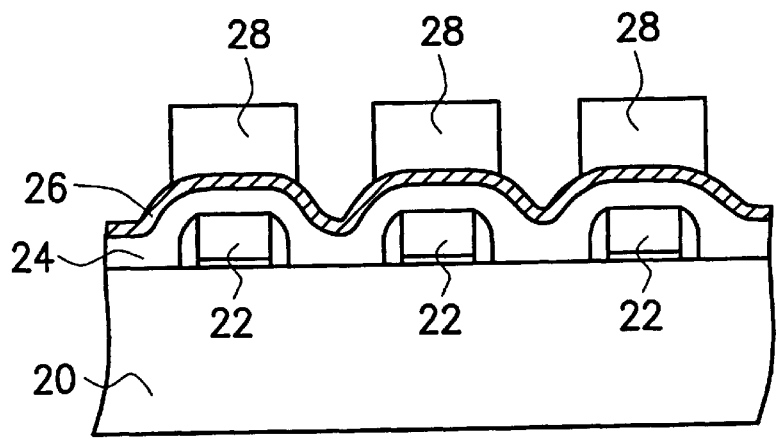
FIGS. 3A and 3B are cross-sectional view showing the architecture of poly fuses in a preferred embodiment according to the invention.
Figure 3B:
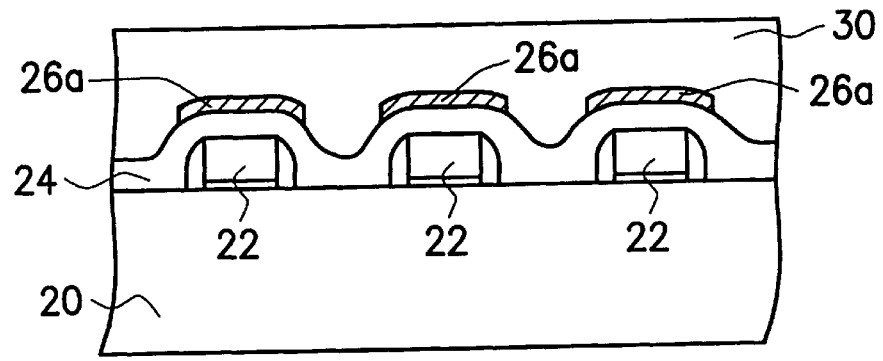
Figure 4:
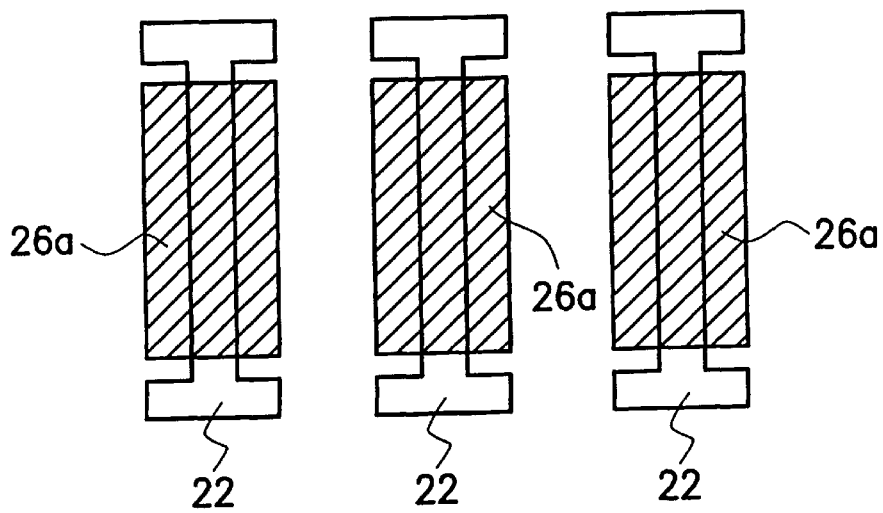
FIG. 4 is a top view of the architecture of poly fuses in a preferred embodiment according to the invention as shown in FIG. 3B.

The invention provides a new architecture of poly fuses. FIGS. 3A and 3B are cross-sectional views of the architecture of poly fuses in a preferred embodiment according to the invention. A top view of the architecture of poly fuses in a preferred embodiment according to the invention is shown in FIG. 4.

Referring to FIG. 3A, a dielectric layer 24 is formed on a provided substrate 20 through a LPCVD process, wherein the substrate 20 contains pre-formed fuses 22, and wherein the fuses 22 include polysilicon. The dielectric layer 24 includes silicon dioxide. An etching stop layer 26 is formed on the dielectric layer 24 through a reactive sputtering process, wherein the etching stop layer includes silicon nitride. A patterned photoresist layer 28 is formed on the etching stop layer 26 for patterning the etching stop layer 26 into 26a, wherein each slice of the sheet-like etching stop layer 26a corresponds to a fuse 22.

Referring to FIG. 3B, a conventional etching process is performed on the etching stop layer 26 to form the patterned etching stop layer 26a, wherein each slice of the patterned sheet-like etching stop layer 26a corresponds to a fuse 22, beneath. The etching stop layer 26a is used to protect fuses 22 from damages. Then, a passivation layer 30, such as silicon dioxide, is formed on the substrate 20 through a CVD process to cover the etching stop layer 26a.

Since each slice of the sheet-like etching stop layer 26a according to the invention only covers a small area over the corresponding fuse 22, it avoids the energy dispersion that causes a low recovery rate while a electrical current or a laser beam is used to break the fuses to recover defective memory cells.

The architecture of poly fuses according to the invention further allow a laser beam operating with a lower power, such as about $10^{-6}$ Joules, to achieve a higher recovery rate around 90%, to improve the low recovery rate according to a conventional architecture of fuses.

In accordance with the foregoing, patterning the etching stop layer 26 into a sheet-like etching stop layer 26a consists of a number of slices reduces the energy dispersion and improve the recovery rate.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An architecture of poly fuses, the architecture comprising:

a plurality of fuses, which are formed on a semiconductor substrate;

a unitary dielectric layer, which is formed on the semiconductor to abut the fuses and the semiconductor substrate;

a sheet-like etching stop layer comprising silicon nitride, which is formed abutting on the unitary dielectric layer, wherein the sheet-like etching stop layer comprises a plurality of slices, and wherein each of the slices corresponds to one of the fuses underneath; and a passivation layer, which covers the sheet-like etching stop layer and the unitary dielectric layer.

2. The architecture of claim 1, wherein the fuses include polysilicon.

3. The architecture of claim 1, wherein the dielectric layer includes silicon dioxide.

4. The architecture of claim 1, wherein the sheet-like etching stop layer includes silicon nitride.

5. The architecture of claim 1, wherein the passivation layer includes silicon dioxide.

* * * * *